(12) United States Patent
Hira et al.

(10) Patent No.: US 10,637,431 B2
(45) Date of Patent: Apr. 28, 2020

(54) ELECTRONIC COMPONENT AND MANUFACTURING METHOD THEREFOR

(71) Applicant: Murata Manufacturing Co., Ltd., Nagaokakyo-shi, Kyoto-fu (JP)

(72) Inventors: Mitsuyoshi Hira, Nagaokakyo (JP); Taku Kikuchi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 778 days.

(21) Appl. No.: 15/290,074

(22) Filed: Oct. 11, 2016

(65) Prior Publication Data
US 2017/0033763 A1    Feb. 2, 2017

Related U.S. Application Data

(63) Continuation of application No. PCT/JP2014/084588, filed on Dec. 26, 2014.

(30) Foreign Application Priority Data

Apr. 14, 2014    (JP) .................................. 2014-082885

(51) Int. Cl.
*H03H 3/08*    (2006.01)
*H03H 9/02*    (2006.01)
*H03H 9/10*    (2006.01)

(52) U.S. Cl.
CPC .......... *H03H 9/02535* (2013.01); *H03H 3/08* (2013.01); *H03H 9/02897* (2013.01); *H03H 9/1085* (2013.01)

(58) Field of Classification Search
CPC ....................... H03H 9/02897; H03H 9/02535
USPC ......... 310/313 B, 313 C; 29/25.35; 333/133, 333/186

IPC .......... H03H 9/02,3/08, 9/25, 9/10, 9/00; H01L 41/047, 41/053, 23/34, 41/22, 41/23, 41/29, 41/297, 23/00, 23/04, 23/12, 23/28, 23/29, 23/31, 23/367, (Continued)

(56) References Cited

U.S. PATENT DOCUMENTS

| | | | |
|---|---|---|---|
| 9,271,400 B2 * | 2/2016 | Kai | .......................... H03H 3/08 |
| 2002/0101304 A1 | 8/2002 | Onishi et al. | |
| 2010/0225202 A1 | 9/2010 | Fukano et al. | |

(Continued)

FOREIGN PATENT DOCUMENTS

| | | | |
|---|---|---|---|
| JP | 2002-261582 A | 9/2002 |
| JP | 2011-055315 A | 3/2011 |

(Continued)

OTHER PUBLICATIONS

Official Communication issued in corresponding International Patent Application No. PCT/JP2014/084588, dated Mar. 3, 2015.

*Primary Examiner* — Thomas M Dougherty
*Assistant Examiner* — Karen B Addison
(74) *Attorney, Agent, or Firm* — Keating & Bennett, LLP

(57) ABSTRACT

An electronic component includes a functional electrode provided on a first substrate that has a rectangular or substantially rectangular plate shape and a support layer including resin that surrounds the functional electrode. A cover member closes an opening of the support layer. A via conductor penetrating the support layer is provided in at least one corner portion of the support layer. A resin reinforcing portion having the same height or substantially the same height as the support layer is provided in an outer side portion of the corner portion provided with the via conductor.

19 Claims, 8 Drawing Sheets

(58) Field of Classification Search
IPC .......................... 41/04, 41/08, 41/187, 41/337, 41/338
See application file for complete search history.

(56) References Cited

U.S. PATENT DOCUMENTS

2010/0253182 A1  10/2010  Takada et al.
2014/0003017 A1   1/2014  Kai et al.

FOREIGN PATENT DOCUMENTS

| | | |
|---|---|---|
| JP | 2011-172190 A | 9/2011 |
| JP | 2012-029134 A | 2/2012 |
| JP | 2013-090228 A | 5/2013 |
| WO | 2009/057699 A1 | 5/2009 |
| WO | 2009/078137 A1 | 6/2009 |
| WO | 2012/132147 A1 | 10/2012 |

* cited by examiner

ELECTRONIC COMPONENT AND MANUFACTURING METHOD THEREFOR

CROSS REFERENCE TO RELATED APPLICATIONS

This application claims the benefit of priority to Japanese Patent Application 2014-082885 filed on Apr. 14, 2014 and is a Continuation Application of PCT/JP2014/084588 filed on Dec. 26, 2014, the entire contents of each application are hereby incorporated herein by reference.

BACKGROUND OF THE INVENTION

1. Field of the Invention

The present invention relates to an electronic component in which a cavity is provided between a substrate and a cover member, and a manufacturing method for the electronic component.

2. Description of the Related Art

International Publication No. 2009/078137 discloses a surface acoustic wave device having a wafer level package structure. In International Publication No. 2009/078137, interdigital transducer (IDT) electrodes are provided on a piezoelectric substrate. A frame-shaped support layer including resin surrounds the IDT electrodes. Via conductors penetrate the support layer. The via conductors are electrically connected to the IDT electrodes. Further, bumps are joined to upper ends of the via conductors.

After the support layer is formed, a cover member is formed to close openings of the support layer.

In actual manufacturing, the above-described laminated structure is formed and then cut into individual surface acoustic wave devices with a dicing machine. In International Publication No. 2009/078137, the support layer is located inside dicing lines. When in a form of a motherboard, a resin connecting portion is formed to connect adjacent support layer parts. This resin connecting portion connects long side portions and to connect short side portions of the support layer parts each shaped like a rectangular frame.

The resin connecting portion is provided adjacent to the via conductors to be joined to the bumps. This arrangement can cause microcracks to form near the bumps. After cutting, each surface acoustic wave device is mounted on a second substrate, which is used to form a WLP (wafer level package) structure or a circuit board by reflow. In this case, stress is applied immediately under the bumps, which can cause cracks to form from the microcracks. The cracks can extend to portions of the piezoelectric substrate present under the support layer or near the support layer.

Further, the cover member sometimes peels from the support layer in the cutting operation. For this reason, for example, when resin molding is further performed, resin may infiltrate inside the support layer.

SUMMARY OF THE INVENTION

Preferred embodiments of the present invention provide an electronic component and a manufacturing method of the electronic component that significantly reduce or prevent the forming of cracks in a substrate during a manufacturing process. However, if cracks do occur in the substrate, the cracks do not substantially extend into a portion of the substrate under a support layer or near the support layer. In addition, the preferred embodiments of the present invention significantly reduce or prevent peeling of a cover member of the electronic component.

According to a preferred embodiment of the present invention, an electronic component includes at least one first substrate shaped as a rectangular or substantially rectangular plate, a functional electrode provided on the at least one first substrate, a frame-shaped support layer including resin and provided on the at least one first substrate to surround the functional electrode, and a cover member that closes an upper opening of the support layer. A via conductor penetrating the support layer is provided in at least one corner portion of the support layer. A resin reinforcing portion having the same or substantially the same height as the support layer is provided in an outer side portion of the at least one corner portion provided with the via conductor.

According to a preferred embodiment of the present invention, the resin reinforcing portion is in contact with the at least one corner portion of the support layer.

According to a preferred embodiment of the present invention, the resin reinforcing portion is separate from the at least one corner portion of the support layer.

Preferably, the at least one corner portion of the support layer includes every corner portion of the support layer, and the resin reinforcing portion is provided in an outer side portion of each of the corner portions of the support layer.

According to a preferred embodiment of the present invention, the at least one first substrate preferably includes four or more first substrates, for example, each including the support layer. When the four or more first substrates are collected so that principal surfaces of the four or more first substrates are flush or substantially flush with one another, the resin reinforcing portion provided in the outer side portion of the at least one corner portion of each of the four first substrates defines a planar shape in which a rectangle is superposed on a center portion of an X-shape in a plan view of the principal surfaces of the first substrates in a section where the at least one corner portion of each of the four first substrates is collected.

According to a preferred embodiment of the present invention, the at least one first substrate includes four or more first substrates each including the support layer, and, when the four or more first substrates are collected so that principal surfaces of the four or more first substrates are flush or substantially flush with one another, the resin reinforcing portion provided in the outer side portion of the at least one corner portion of each of the four first substrates defines at least a portion of an X-shape in a plan view of the principal surfaces of the first substrates in a section where the at least one corner portion of each of the four first substrates is collected.

According to a preferred embodiment of the present invention, the resin reinforcing portion has a rectangular or substantially rectangular planar shape.

According to a preferred embodiment of the present invention, the electronic component further includes a second substrate and a mold resin layer provided on the second substrate. A structure in which the at least one first substrate, the support layer, and the cover member are stacked is mounted on the second substrate, and is covered with the mold resin layer.

According to a preferred embodiment of the present invention, the at least one first substrate is a piezoelectric substrate, the functional electrode includes an interdigital transducer electrode, and the electronic component is a surface acoustic wave device.

An electronic-component manufacturing method according to a preferred embodiment of the present invention includes a step of preparing a collective board in which first substrates are collected when the at least one first substrate includes the first substrates, a step of forming, on the collective board, the functional electrode, the support layer, and the resin reinforcing portion corresponding to each of electronic components, a step of forming a cover member that covers the opening of the support layer, and a step of cutting the collective board to form the at least one first substrate in each of the electronic components.

According to the electronic components and the manufacturing methods of various preferred embodiments of the present invention, the resin reinforcing portion having the same or substantially the same height as the support layer is provided in an outer side portion of at least one corner portion of the support layer. Hence, even when cutting with a dicing machine is performed during manufacturing of an electronic component by using a collective board in which substrates each including the support layer and the resin reinforcing portion are collected, forming of cracks in the substrates is significantly reduced or prevented. Moreover, peeling of the cover member is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be made clear through description of specific preferred embodiments of the present invention with reference to the drawings.

Figure 1:
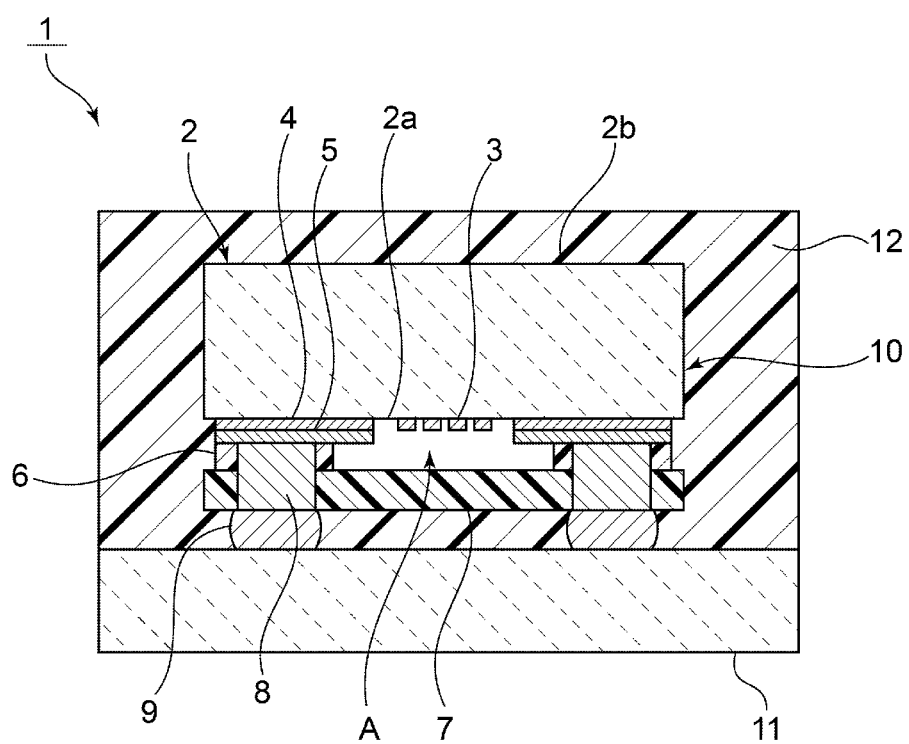
FIG. 1 is a schematic elevational cross-sectional view of an electronic component according to a preferred embodiment of the present invention.

FIG. 1 is a schematic elevational cross-sectional view of an electronic component according to a preferred embodiment of the present invention. An electronic component 1 includes a first substrate 2. In this preferred embodiment, the first substrate 2 is defined by a piezoelectric substrate. The material of the first substrate 2 is not particularly limited, and may include a piezoelectric single crystal, for example, $LiNbO_3$ or $LiTaO_3$. Alternatively, a material of the first substrate 2 may include piezoelectric ceramics.

The first substrate 2 includes a first principal surface 2a and a second principal surface 2b opposed to the first principal surface 2a. A functional electrode 3 is defined on the first principal surface 2a. In this preferred embodiment, the functional electrode includes an IDT electrode. The electronic component 1 is a surface acoustic wave device including the IDT electrode. However, the structure of the functional electrode 3 is not limited to the structure including the IDT electrode. That is, in the present invention, the electronic component is not limited to the surface acoustic wave device. Therefore, the functional electrode preferably includes an appropriate electrode structure that realizes the function as the electronic component, for example. Further, the first substrate 2 may include, for example, an insulating substrate or a semiconductor substrate.

A first wiring layer 4 is electrically connected to the functional electrode 3. The first wiring layer 4 is provided on the first principal surface 2a of the first substrate 2, and is electrically connected to the functional electrode 3 (not shown). A second wiring layer 5 is stacked on the first wiring layer 4.

A support layer 6 including resin surrounds a section where the functional electrode 3 is provided. As will be described later, the support layer 6 is shaped as a rectangular or substantially rectangular frame including an opening.

A cover member 7 closes the opening of the support layer 6. The cover member 7 is preferably formed of synthetic resin, for example. However, the cover member 7 may be formed of, for example, an insulating ceramic material.

Through holes penetrate the support layer 6 and the cover member 7. In these through holes, via conductors 8 are provided. The via conductors 8 are each connected at one end to the second wiring layer 5. The via conductors 8 provide under-bump metal layers. That is, bumps 9 are joined to the via conductors 8. The bumps 9 are preferably formed of Au or solder, for example. The functional electrode 3, the first and second wiring layers 4 and 5, the support layer 6, the cover member 7, and the bumps 9 are provided on the first substrate 2. This structure defines an electronic component element 10. The electronic component element 10 is a surface acoustic wave element. The electronic component element 10 is mounted on lands of a second substrate 11 by the bumps 9. A mold resin layer 12 covers the electronic component element 10.

The support layer 6 includes resin and is shaped as a rectangular or substantially rectangular frame defines a cavity A that faces the functional electrode 3.

To manufacture the electronic component 1 of this type, a collective board is prepared by collecting multiple first substrates 2. On the collective board, functional electrodes 3, first and second wiring layers 4 and 5, and support layers 6 are formed for each electronic component element 10. After that, a cover member 7 is stacked, and via conductors 8 are then formed.

Then, the collective board is cut along dicing lines after or before the bumps 9 are joined, to provide individual electronic component elements 10.

The forming of cracks in the first substrate 2 are significantly reduced or prevented by the above-described features of the electronic component 1. In addition, for example, peeling of the cover member 7 from the support layer 6 is also significantly reduced or prevented due to a resin reinforcing portion being provided in an outer side portion of at least one corner portion of the support layer 6, as described below with reference to FIGS. 2A, 2B, 2C, 3, and 4.

Figure 2A:
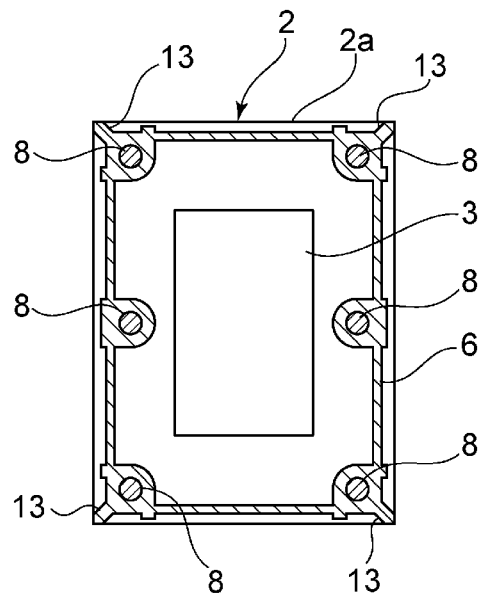
FIG. 2A is a schematic plan view showing an electronic component according to a preferred embodiment of the present invention with a cover member removed.

FIG. 2A is a schematic plan view showing the relationship between the first substrate 2 and the support layer 6 after cutting. The cover member 7 is omitted from FIG. 2A.

The support layer 6 is shaped as a rectangular or substantially rectangular frame and provided on the first principal surface 2a of the first substrate 2, which is preferably is formed as a rectangular or substantially rectangular plate by cutting, so that the support layer 6 is separated inward by a predetermined distance from an outer edge of the first substrate 2. The functional electrode 3 is provided in a region surrounded by the support layer 6. Here, only the position of the region where the functional electrode 3 including the IDT electrode is provided is shown by a rectangular or substantially rectangular frame.

In FIG. 2A, the first and second wiring layers are not shown, for clarity.

The first substrate 2 is shaped as a rectangular or substantially rectangular plate. The support layer 6 is shaped as a rectangular or substantially rectangular frame. Therefore, the support layer 6 includes four corner portions. In the four corner portions, the support layer 6 partly projects inward. In these projecting portions, the via conductors 8 penetrate the support layer 6. In center portions of a pair of long sides of the support layer 6, the support layer 6 also partly projects inward. In these projecting portions, the via conductors 8 are provided. Therefore, six via conductors 8 are provided in one electronic component 1.

Figure 2B:
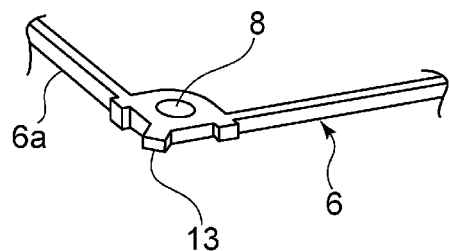
FIG. 2B is an enlarged partly cutaway perspective view showing a corner portion of a support layer in detail.

Resin reinforcing portions 13 are provided in outer side portions of the four corner portions of the rectangular or substantially rectangular-frame-shaped support layer 6. As shown in FIG. 2B, the resin reinforcing portions 13 extend in a direction to connect corner portions of the first substrate 2 and the corner portions of the support layer 6. Specifically, the resin reinforcing portions 13 project from the corner portions of the support layer 6 in a direction to define an angle of about 45° with long sides 6a of the support layer 6, for example. The resin reinforcing portions 13 have the same or substantially the same height as the support layer 6. Further, the resin reinforcing portions 13 are preferably formed of the same resin material as that for the support layer 6. However, the resin reinforcing portions 13 may be formed of a resin material different from the resin material for the support layer 6.

Since the resin reinforcing portions 13 are provided in the electronic component 1, the forming of cracks extending to a portion of the first substrate 2 under or near the support layer from a microcrack caused in the cutting operation during manufacturing is significantly reduced or prevented. Further, even if a microcrack occurs in a portion of the piezoelectric substrate near any resin reinforcing portion 13, the microcrack does not extend or significantly extend into the region surrounded by the support layer 6. Still further, the above-described peeling of the cover member 7 is significantly reduced or prevented. This will be made clear by a more specific description of the manufacturing method with reference to FIGS. 3 to 5.

Figure 3:
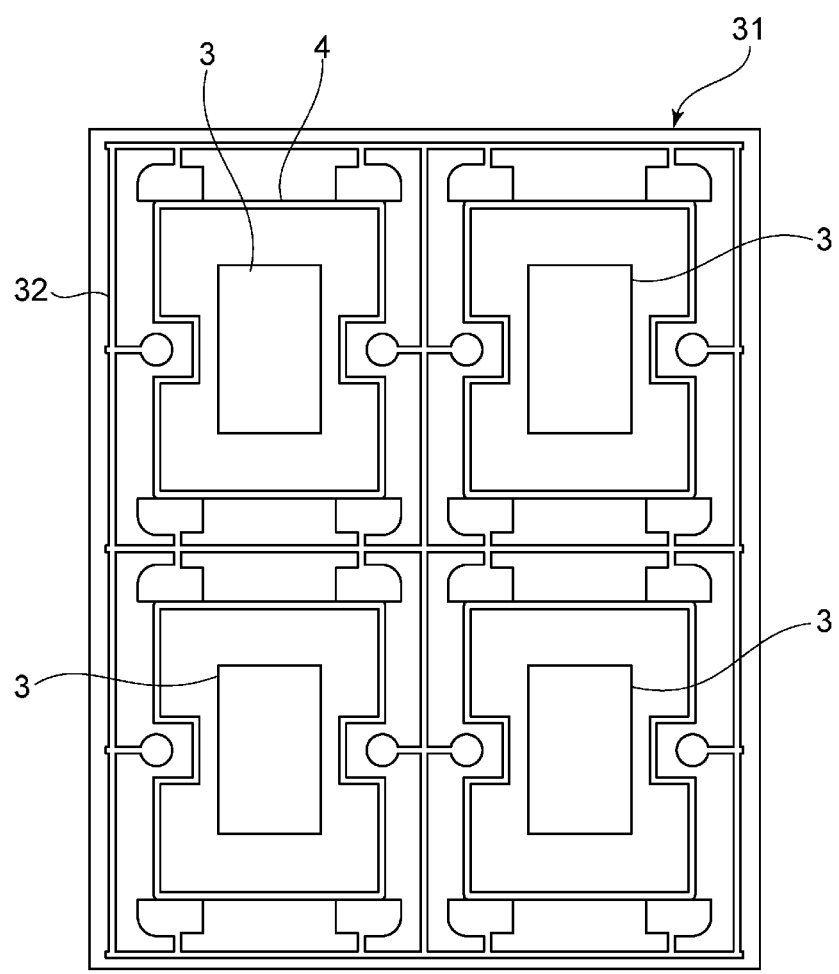
FIG. 3 is a schematic plan view showing a collective board prepared in an electronic-component manufacturing method according to a preferred embodiment of the present invention and an electrode structure provided on the collective board.

To manufacture the above-described electronic component 1, a collective board 31 shown in FIG. 3 is prepared. A section of the collective board 31 where four first substrates are collected is shown. However, four first substrates are shown for clarity, and the collective board 31 preferably includes more than four first substrates.

Functional electrodes 3 are formed in sections of the collective board 31 where individual electronic component elements are to be located. Further, first wiring layers 4 are formed to be connected to the functional electrodes 3. Still further, power feed lines 32 are formed to define under-bump metal layers.

Figure 2C:
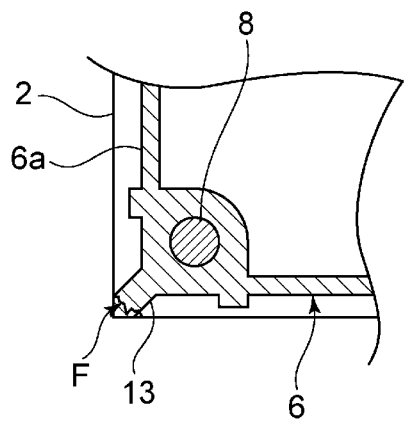
FIG. 2C is a partly cutaway plan view showing the position of a crack caused in a substrate in an outer side portion of the corner portion of the support layer.

Next, support layers 6 each shaped as a rectangular or substantially rectangular frame and resin reinforcing portions 13 shown in FIG. 2C are formed on the collective board 31. The cover member 7 shown in FIG. 1 is formed to close openings of the support layers 6. To form the cover member 7, a mother cover member is stacked.

After that, through holes are formed to penetrate the cover member 7 and the support layers 6. Then, via conductors 8 are formed by electroplating using the power feed lines 32.

The collective board 31 is then cut into a plurality of first substrates 2 with a dicing blade. Finally, bumps 9 are formed in the structure of each electronic component element. The bumps 9 may be formed before cutting.

Figure 5:
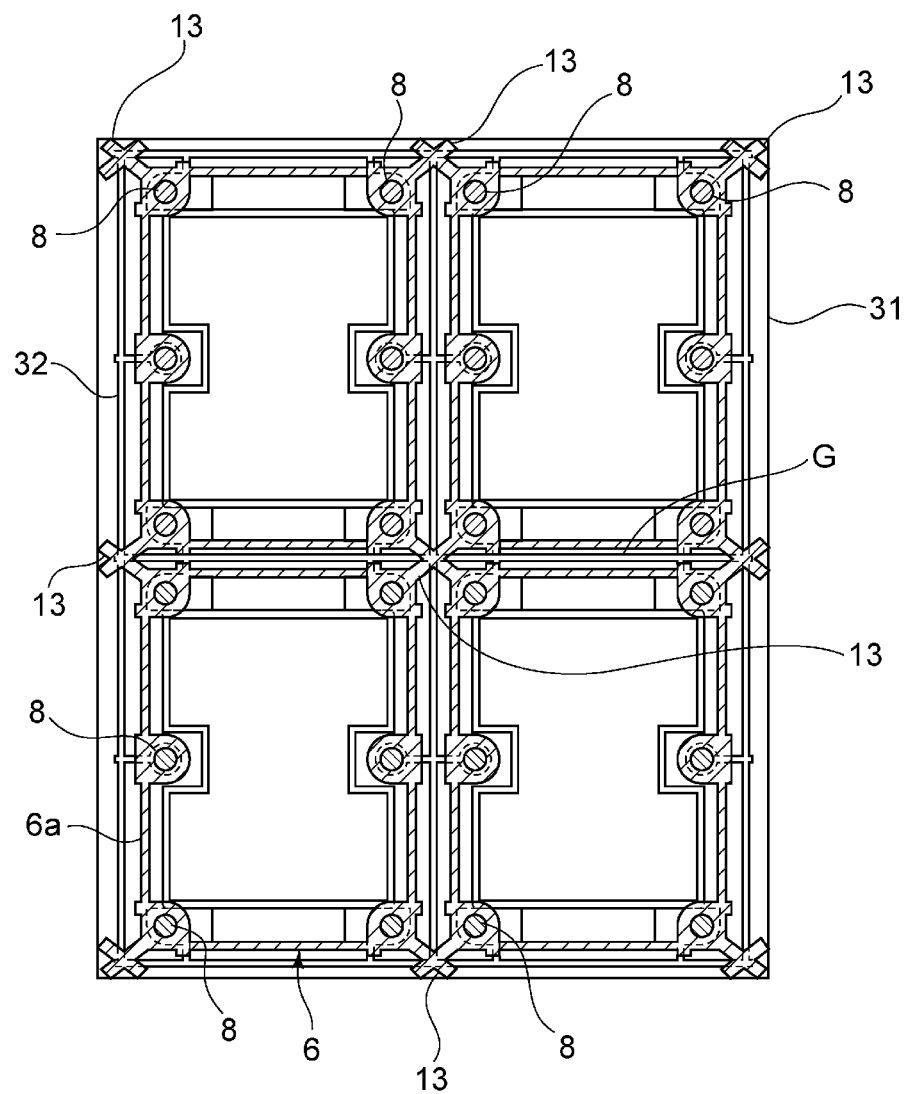
FIG. 5 is a schematic plan view showing the positional relationship between the electrode structure and the support layers on the collective board prepared according to a preferred embodiment of the present invention.

FIG. 5 shows a structure in which the support layers 6 and the resin reinforcing portions 13 are formed on the collective board 31 after the functional electrodes and the power feed lines 32 are formed thereon.

Figure 4:
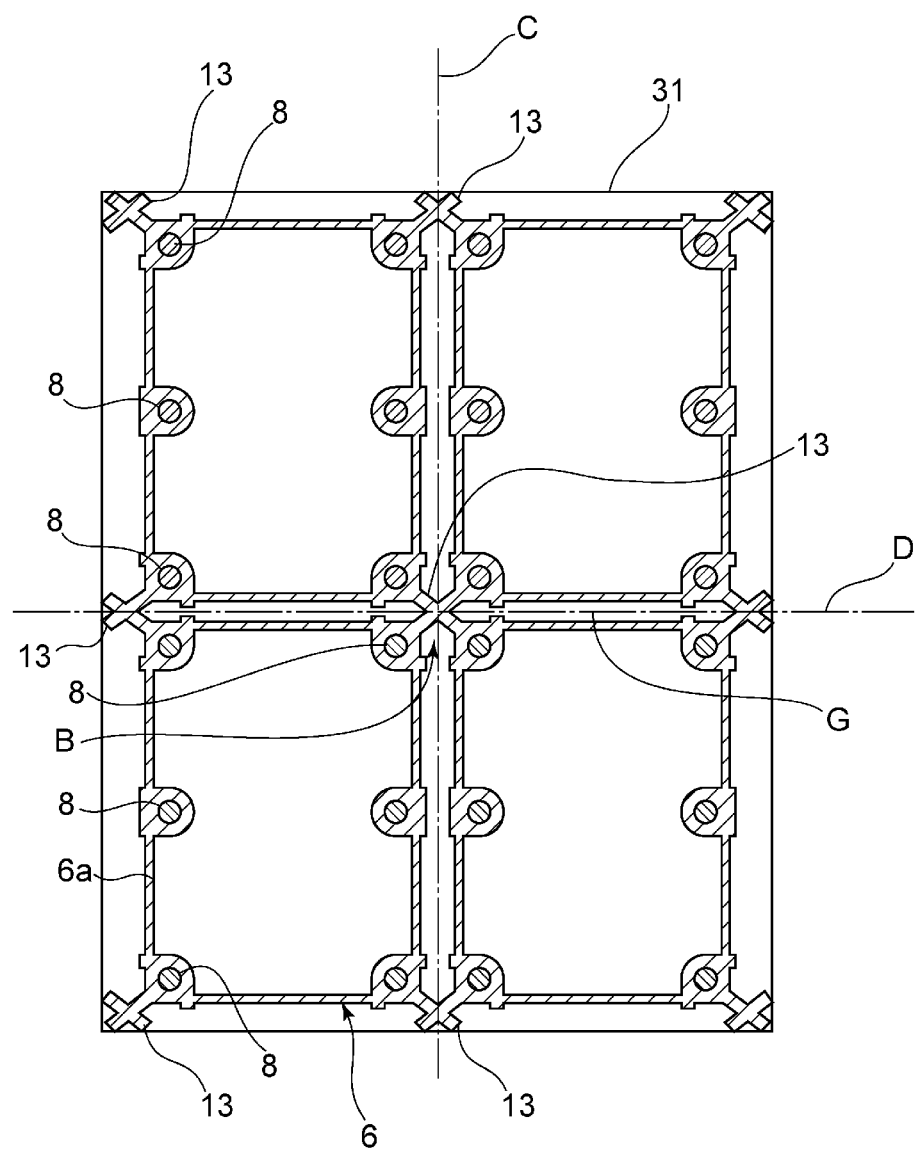
FIG. 4 is a schematic plan view of a section where four support layers are collected on the collective board prepared in an electronic-component manufacturing method according to a preferred embodiment of the present invention.

FIG. 4 is a schematic plan view of a shape such that the power feed lines 32 and the functional electrodes are removed from FIG. 5. That is, for clarity, only a plurality of support layers 6 and a plurality of resin reinforcing portions 13 are shown in FIG. 4.

As described above, four electronic-component-element forming sections are collected on the collective board 31 so that their substrate surfaces are flush or substantially flush with one another. Therefore, in a portion shown by arrow B, corner portions of the support layers 6 are collected. In other words, four corner portions are collected. In the portion shown by arrow B, the resin reinforcing portions 13 define an X-shape in plan view. As described above, the resin reinforcing portions 13 have the same or substantially the same height as the support layers 6. When the planar shape is such an X-shape, the amount of the resin reinforcing portions 13 to be cut in the cutting operation is small. Therefore, problems that may occur in the cutting operation, for example, clogging of the dicing blade, are significantly reduced or prevented.

Dicing lines are shown by one-dot chain lines C and D in FIG. 4. The dicing lines have a width corresponding to the thickness of the dicing blade. Therefore, when the resin reinforcing portions 13 are cut and divided with the dicing blade, a center portion of the X-shape is removed. As a result, in corner portions of a finally obtained electronic component 1, resin reinforcing portions 13 are each shaped as a projecting portion projecting to define an angle of about 45° with the long side 6a of the corresponding support layer 6, as shown in FIG. 2B. When the resin reinforcing portions 13 are joined to the long side 6a of the support layer 6 having a width smaller than that of the projecting portions, the long side 6a of the support layer 6 may deform in a resin solidification process. This deformation may form a gap in a joint portion between the cover member 7 and the support layer 6.

The above-described cutting operation is performed while the mother cover member is stuck. In this case, when the resin reinforcing portions 13 are provided, the joint strength is higher than when the resin reinforcing portions 13 are not provided. Hence, peeling of the cover member in the cut portion during the cutting operation is significantly reduced or prevented. In the cutting operation, portions of the cover member 7 near the corner portions receive cutting stress twice in the row direction and the column direction.

However, the joint strength between the cover member 7 and the collective board 31 is increased by the resin reinforcing portions 13. Therefore, peeling of the cover member is significantly reduced or prevented.

In addition, when cutting is performed, the cut surface is likely to be roughened in a portion where the cutting force changes. Therefore, a microcrack might be caused in portions on the cut surface of the mother collective board 31 where the resin reinforcing portions 13 are provided, particularly at the boundaries with the resin reinforcing portions 13. More specifically, in the corner portion, microcracks may be caused in one cut surface and the other cut surface on both sides of the corner portion. For this reason, any crack that occurs is likely to extend in a direction to connect the microcracks on both sides of the corner portion. That is, in an outer side portion of the corner portion of the support layer 6, any crack that occurs is likely to extend to connect one side and the other side that define a corner portion schematically shown by arrow F in FIG. 2C. Therefore, the occurrence of a crack that reaches the inside of the support layer 6 is significantly reduced or prevented.

On the other hand, when the electronic component element 10 is mounted on the second substrate 11, preferably, an ultrasonic joining method or process or a reflow method or process is used, for example. In a heating step of these methods, temperature change occurs in the electronic component element. For this reason, thermal stress is generated by the influence of, for example, the difference in coefficient of linear expansion among the resin reinforcing portions 13, the support layer 6, the first substrate 2, and the via conductors 8. The thermal stress is large at boundaries of the resin reinforcing portions 13, the support layer 6, the first substrate 2, and the via conductors 8, and microcrack growth is most likely to occur near the via conductors provided in the support layer. In this preferred embodiment, however, the resin reinforcing portions 13 are provided in the corner portions of the first substrate 2, and the locations of microcracks from which crack growth may start are kept away from the via conductors 8. That is, for example, the resin reinforcing portions 13 where the cutting force changes are not provided adjacent to or in the vicinity of the via conductors 8 provided on the long sides 6a of the support layer 6. The resin reinforcing portions 13 are only provided in the outer side portions of the corner portions of the support layer 6 shaped as a rectangular or substantially rectangular frame. Therefore, even when the resin reinforcing portions 13 and the first substrate 2 are both cut, since a cutting position is in the corner portions of the first substrate 2 and in the outer side portions of the corner portions of the support layer 6, any microcracks that occur are likely to be located farther from the via conductors 8 than in a case in which the resin reinforcing portions 13 is provided beside the long sides 6a of the support layer 6. Hence, the forming of cracks in the lower portions or vicinities of the long sides 6a of the support layer 6 by the growth of microcracks in the method such as the ultrasonic joining method or the reflow method is significantly reduced or prevented.

In the electronic component 1, after the electronic component element 10 is obtained, as described above, it is mounted on the second substrate 11 by using the bumps 9. At this time, cracks in the first substrate 2 do not extend or substantially extend into the inside of the support layer 6, as described above.

Further, a mold resin layer 12 shown in FIG. 1 is formed to obtain the electronic component 1. In this case, peeling of the cover member 7 from the support layer 6 is significantly reduced or prevented, as described above. For this reason, it is possible to significantly reduce or prevent the mold resin from entering the support layer 6 via a crack or a peeled portion. Hence, it is possible to obtain an electronic component 1 with stable characteristics.

In addition, during electroplating for forming the via conductors 8, plating solution is unlikely to infiltrate inside the support layer 6. This is because the resin reinforcing portions 13 are provided in the outer side portions of the corner portions between adjacent support layers 6 in the state of the collective board 31. The plating solution is unlikely to enter not only the support layers 6 but also a gap G between the support layers 6 shown in FIG. 4. Hence, when infiltration of the plating solution inside the support layer 6 through the gap G is able to be significantly reduced or prevented, the increase in abrasion of the dicing blade and damage to the piezoelectric substrate due to the change in cutting stress is able to be prevented in the cutting step. Alternatively, when the mold resin enters the cavity defined by sealing with the first substrate 2, the support layer 6, and the cover member 7 from the gap G via a crack caused in the joint portion between the support layer 6 and the first substrate 2, the mold resin sometimes reaches the position of the IDT electrode, which can cause a short circuit of wiring or deterioration of excitation.

Figure 6:
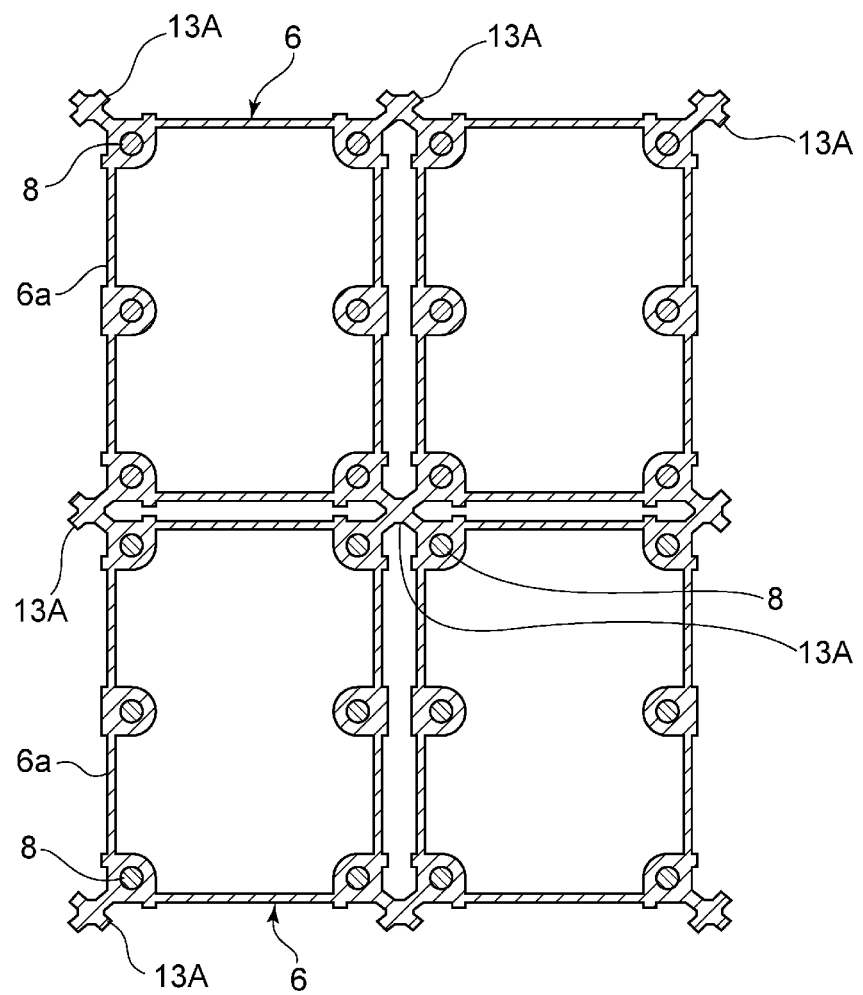
FIG. 6 is a schematic plan view showing a first modification of a preferred embodiment of the present invention of the shape of resin reinforcing portions.

While the resin reinforcing portions 13 having the planar shape shown in FIG. 4 are provided in the above-described preferred embodiment, the resin reinforcing portions 13 may have other shapes. For example, in a first modification shown in FIG. 6, resin reinforcing portions 13A have a shape such that a square is superposed on a center portion of an X-shape in plan view of a first principal surface 2a. Even with such a shape, similar advantages to those of the above preferred embodiment are able to be obtained by the resin reinforcing portions 13A. Further, since the square is superposed on the X-planar shape, denting of center portions of the resin reinforcing portions 13A by the fluidity of resin is significantly reduced or prevented. Therefore, the resin reinforcing portions 13A provide a sufficient joint-strength reinforcing effect.

Figure 7:
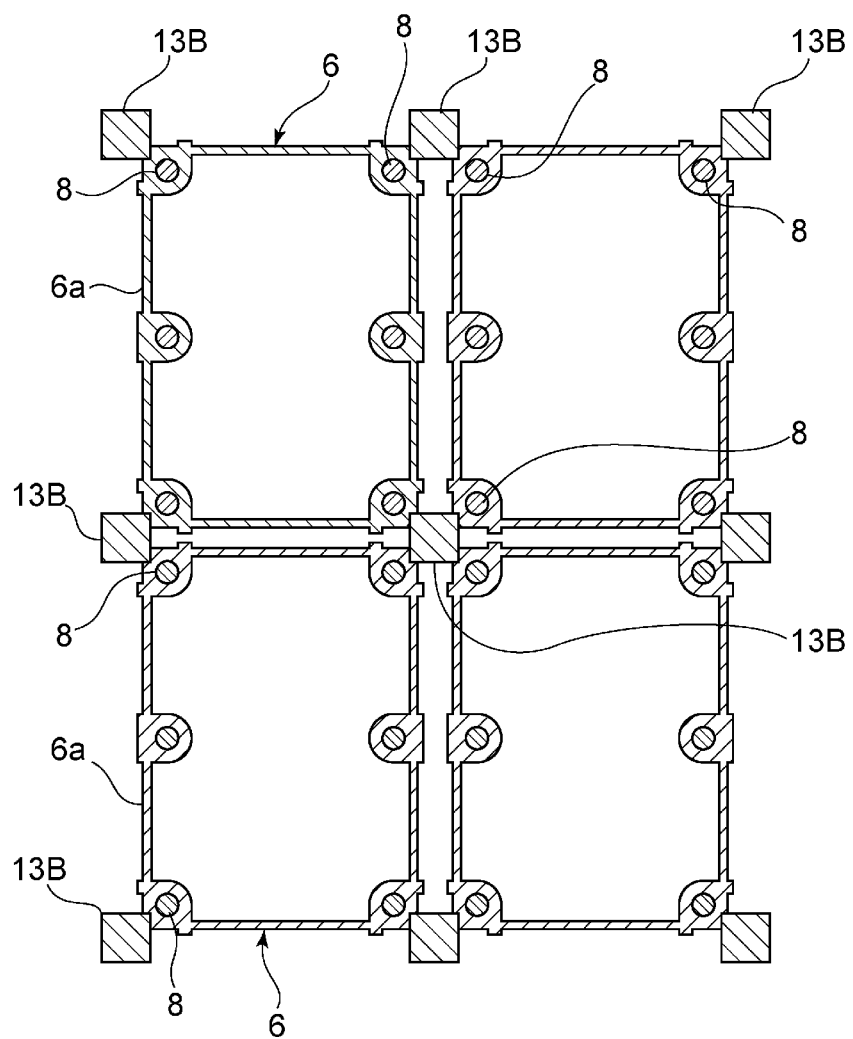
FIG. 7 is a schematic plan view showing a second modification of a preferred embodiment of the present invention of the shape of the resin reinforcing portions.

FIG. 7 is a schematic plan view showing a second modification of the resin reinforcing portions. Resin reinforcing portions 13B shown in FIG. 7 have a square or substantially square shape in plan view of a first principal surface 2a. The resin reinforcing portions 13B having a square or substantially square planar shape are provided so that corner portions of squares are in contact with corner portions of support layers 6. In this way, resin reinforcing portions having a planar shape of a rectangle may be provided.

Figure 8:
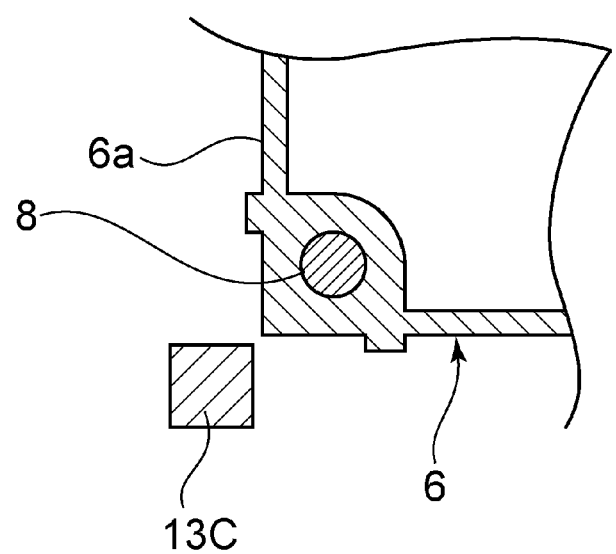
FIG. 8 is a partly cutaway plan view showing a modification of a preferred embodiment of the present invention in which a resin reinforcing portion is separate from a corner portion of a support layer.

While the resin reinforcing portions 13, 13A, and 13B are in contact with the corner portions of the support layers 6 in the preferred embodiments and the first and second modifications described above, resin reinforcing portions 13C may be separate from the corner portions of the support layers 6, as shown in FIG. 8. However, the resin reinforcing portions are preferably in contact with the corner portions of the support layers 6 to significantly reduce or prevent infiltration of plating solution.

While the electronic component 1 preferably is a resin-molded surface acoustic wave device in the above preferred embodiment, preferred embodiments of the present invention can be applied to various electronic components, each including a cavity, other than the surface acoustic wave device. The second substrate 11 and the mold resin layer 12 do not always need to be provided, and the electronic component 1 may be the above-described electronic component element 10.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   at least one first substrate with a rectangular or substantially rectangular plate shape;
   a functional electrode provided on the at least one first substrate;
   a frame-shaped support layer including resin and provided on the at least one first substrate to surround the functional electrode; and
   a cover member that closes an upper opening of the support layer; wherein
   a via conductor penetrating the support layer is provided in at least one corner portion of the support layer;
   a resin reinforcing portion having a same height or substantially the same height as the support layer is provided at an outer side portion of the at least one corner portion provided with the via conductor; and
   the resin reinforcing portion is located along a line that extends through a corner of the rectangular or substantially rectangular plate shape and the via conductor towards an inside of the support layer.

2. The electronic component according to claim 1, wherein the resin reinforcing portion is in contact with the at least one corner portion of the support layer.

3. The electronic component according to claim 1, wherein the resin reinforcing portion is separate from the at least one corner portion of the support layer.

4. The electronic component according to claim 1, wherein the at least one corner portion of the support layer includes every corner portion of the support layer, and the resin reinforcing portion is provided at an outer side portion of every one of the at least one corner portion of the support layer.

5. The electronic component according to claim 1, wherein the at least one first substrate includes four or more first substrates each including the support layer.

6. The electronic component according to claim 5, wherein, when the four or more first substrates are collected so that principal surfaces of the four or more first substrates are flush or substantially flush with one another, the resin reinforcing portion provided at the outer side portion of the at least one corner portion of each of the four first substrates defines a planar shape in which a rectangle is superposed on a center portion of an X-shape in a plan view of the principal surfaces of the first substrates in a section where the at least one corner portion of each of the four first substrates is collected.

7. The electronic component according to claim 5, wherein, when the four or more first substrates are collected so that principal surfaces of the four or more first substrates are flush or substantially flush with one another, the resin reinforcing portion provided at the outer side portion of the at least one corner portion of each of the four first substrates defines at least a portion of an X-shape in a plan view of the principal surfaces of the first substrates in a section where the at least one corner portion of each of the four first substrates is collected.

8. The electronic component according to claim 1, wherein the resin reinforcing portion has a rectangular or substantially rectangular planar shape.

9. The electronic component according to claim 1, further comprising a second substrate and a mold resin layer provided on the second substrate; wherein
   a structure in which the at least one first substrate, the support layer, and the cover member are stacked is mounted on the second substrate, and is covered with the mold resin layer.

10. The electronic component according to claim 1, wherein the at least one first substrate, the support layer, and the cover member are stacked and mounted on the second substrate.

11. The electronic component according to claim 1, wherein:
   the at least one first substrate is a piezoelectric substrate;
   the functional electrode includes an interdigital transducer electrode; and
   the electronic component is a surface acoustic wave device.

12. The electronic component according to claim 1, wherein the least one corner portion of the support layer includes a projecting portion that projects toward an inner portion of the support layer.

13. The electronic component according to claim 1, wherein the via conductor is provided in the projecting portion of the at least one corner portion.

14. The electronic component according to claim 1, wherein the resin reinforcing portion extends in a direction to connect at least two corner portions of the support layer.

15. The electronic component according to claim 1, wherein the resin reinforcing portion is made of a same material as the support layer.

16. The electronic component according to claim 1, wherein the resin reinforcing portion defines an angle of about 45° with a long side of the support layer.

17. A manufacturing method of the electronic component according to claim 1, the manufacturing method comprising:
   a step of preparing a collective board in which first substrates are collected when the at least one first substrate includes the first substrates;
   a step of forming, on the collective board, the functional electrode, the support layer, and the resin reinforcing portion corresponding to each of electronic components;
   a step of forming a cover member that covers the opening of the support layer; and
   a step of cutting the collective board to define the at least one first substrate in each of the electronic components.

18. The method according to claim 17, wherein the step of cutting includes performing a cutting operation in at least two different directions.

19. The method according to claim 17, further comprising a step of mounting the first substrate onto a second substrate.

* * * * *